(12) United States Patent
Kasahara

(10) Patent No.: US 8,072,279 B2
(45) Date of Patent: Dec. 6, 2011

(54) CRYSTAL OSCILLATOR WITH PEDESTAL

(75) Inventor: Kenji Kasahara, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 70 days.

(21) Appl. No.: 12/657,907

(22) Filed: Jan. 29, 2010

(65) Prior Publication Data
US 2010/0201453 A1 Aug. 12, 2010

(30) Foreign Application Priority Data

Feb. 10, 2009 (JP) .................................. 2009-027979
Oct. 14, 2009 (JP) .................................. 2009-237156

(51) Int. Cl.
*H03B 5/12* (2006.01)

(52) U.S. Cl. . 331/158; 331/68; 331/116 R; 331/116 FE; 331/108 C; 257/700

(58) Field of Classification Search .................. 257/700, 257/724; 331/158, 68, 116 R, 116 FE, 108 C
See application file for complete search history.

(56) References Cited

FOREIGN PATENT DOCUMENTS

| JP | 2000-286661 | 10/2000 |
|---|---|---|
| JP | 2006-332932 | 12/2006 |

*Primary Examiner* — Arnold Kinkead
(74) *Attorney, Agent, or Firm* — Scott D. Wofsy; Edwards Wildman Palmer LLP

(57) ABSTRACT

An object of the invention is to provide an oscillator with a pedestal that facilitates soldering operations and offers a high level of productivity. A surface mount crystal oscillator with a pedestal comprises a crystal oscillator with lead wires led out from a bottom surface of a metallic base thereof; and a pedestal having a substantially rectangular outer shape in plan view, has insertion holes through which the lead wires pass, and is attached to a bottom surface of the crystal oscillator, and has mount terminals to be electrically connected to the lead wires formed on a bottom surface thereof. The configuration is such that the insertion holes are provided in four corner sections of the pedestal, in the four corner sections of the bottom surface of the pedestal where the insertion holes are formed there is provided a recess with an open outer periphery, and the lead wire is connected to a terminal electrode formed inside the recess, using solder.

18 Claims, 9 Drawing Sheets

CRYSTAL OSCILLATOR WITH PEDESTAL

BACKGROUND OF THE INVENTION

1. Technical Field

The present invention relates to a surface mount crystal oscillator with a pedestal (hereunder, referred to as "oscillator with a pedestal"), and in particular to an oscillator with a pedestal that enables easy attachment of a pedestal to a crystal oscillator.

2. Background Art

Crystal oscillators that serve as frequency control devices used for mobile communication devices or transmission communication devices, are well known. As one of these crystal oscillators, there has been widely used a lead-type crystal oscillator in which lead wires are perpendicularly implanted in the bottom surface of the oscillator. On the other hand, while surface mounting of electronic components has made progress, there has also been a demand to be able to surface mount a crystal oscillator. Under such a background, there has been proposed a crystal oscillator with a pedestal in which a pedestal is attached on an existing lead-type crystal oscillator thereby enabling surface mounting thereof (refer to Japanese Unexamined Patent Publication No. 2000-286661 (Patent Document 1)).

3. Prior Art

FIG. 6 and FIG. 7 are drawings for describing an oscillator with a pedestal of a conventional example, wherein FIG. 6A is a front view thereof, FIG. 6B is a bottom view thereof, and FIG. 6C is a sectional view thereof taken along the line VI-VI of FIG. 6B. FIG. 7 is an exploded isometric view of a pedestal of the conventional example, wherein FIG. 7A shows an exploded view of a first substrate and FIG. 7B shows an exploded view of a second substrate.

Here, there is described an oscillator with a pedestal disclosed in Japanese Unexamined Patent Publication No. 2006-332932 (Patent Document 2). Although it is described as a crystal resonator with a pedestal in this Patent Document 2, a similar configuration can be applied to a crystal oscillator with a pedestal, and therefore it is described here as a crystal oscillator with a pedestal.

In this crystal oscillator with a pedestal, a pedestal 2 is attached to a crystal oscillator 1 as shown in FIG. 6A to FIG. 6C. The crystal oscillator 1 is configured with a crystal resonator (not shown in the drawing) and an oscillation circuit element (not shown in the drawing) housed (enclosed) inside a metallic base 3, and a metallic cover 4 joined thereon. On an outer bottom surface 3a of the metallic base 3 of the crystal oscillator 1, there are provided stand-offs 5, thereby preventing electrical short circuit between a mounting substrate (not shown in the drawing) and the metallic base 3, when the crystal oscillator 1 is directly mounted on the mounting substrate. On the outer bottom surface 3a of the crystal oscillator 1, there are implanted four lead wires 6 perpendicular to the outer bottom surface 3a. The lead wires 6 are electrically connected to the oscillation circuit element and the like housed in the metallic base 3.

Next, the pedestal 2 comprises a laminated plate comprising a first substrate 7 serving as an upper layer and a second substrate 8 serving as a lower layer. Moreover, the pedestal 2 has insertion holes 9a and 9b in portions thereof corresponding to the lead wires 6. Here, the radius of the insertion hole 9b formed in the second substrate 8 is made greater than the radius of the insertion hole 9a of the first substrate 7 (refer to FIG. 7A and FIG. 7B). Moreover, each of the lead wires 6 passes through each of the insertion holes 9a of the first substrate 7. On the inner side surface of each insertion hole 9a, there is formed a metallic film that serves as a conducting path 10a (refer to FIG. 6C).

On the outer periphery of the insertion hole 9a on the lamination surface of the first substrate 7 that is to have the second substrate 8 laminated thereon, as shown in FIG. 6C, there is formed a terminal electrode 11, and on a bottom surface 8a of the second substrate 8 that serves as the bottom surface of the pedestal 2, there are formed mount terminals 12. The lead wire 6 having passed through the insertion hole 9a is electrically connected to the terminal electrode 11 by means of solder 13. Moreover, the solder 13 also flows into the insertion hole 9a, and consequently the lead wire 6 is electrically and mechanically connected to the conducting path 10a. As a result, the lead wire 6 is electrically connected to the mount terminal 12 via; the terminal electrode 11 and the conducting path 10a, a conducting path 10b formed on a surface 7a of the first substrate 7 facing the crystal oscillator 1, and a conducting path 10c formed on the side surface of the pedestal 2.

PROBLEMS IN PRIOR ART

However, in the oscillator with a pedestal of the conventional example in the above configuration, there is a problem in that it is difficult to perform a soldering operation. That is to say, in the crystal oscillator with a pedestal in the above configuration, soldering needs to be performed in order to connect the lead wire 6 to the terminal electrode 11. This soldering is often manually performed using a soldering iron 14 as shown in FIG. 6C. Here, normally, the diameter of the insertion hole 9b of the second substrate 8 is approximately 2.5 mm, and moreover, the diameter of the tip end of the soldering iron 14 is approximately 1.2 mm. Therefore, there is a problem in that it is difficult to freely move the soldering iron 14 within the insertion hole 9b to perform a manual operation, and consequently it is difficult to perform a soldering operation.

In order to solve this problem, Patent Document 2 (refer to paragraph [0023] and FIG. 5 thereof) proposes an oscillator with a pedestal shown in FIG. 8 and FIG. 9. Here, FIG. 8 and FIG. 9 are drawings of the oscillator with a pedestal, wherein FIG. 8A is a bottom view thereof, FIG. 8B is a sectional view thereof taken along the line VIII-VIII, and FIG. 9A and FIG. 9B are exploded isometric views of the pedestal.

Each of the insertion holes 9b here is formed in an oval shape so as to include a pair of insertion holes 9a in the vicinity thereof as shown in FIG. 8A and FIG. 9B. As a result, a range W within which the soldering iron 14 can be moved, is increased, and consequently soldering becomes easier. However, even in this case, the soldering iron 14 can only be freely moved in the direction of the insertion hole 9a that is paired with the insertion hole 9a being soldered, and it can not be freely moved in the widthwise direction thereof. Therefore, there is a problem in that the difficulty in soldering operations is not sufficiently overcome.

PURPOSE OF THE INVENTION

An object of the present invention is to provide an oscillator with a pedestal that facilitates soldering operations and offers a high level of productivity.

SUMMARY OF THE INVENTION

The present invention is a surface mount crystal oscillator with a pedestal comprising: a crystal oscillator with lead wires led out from a bottom surface of a metallic base thereof; and a pedestal that is of a substantially rectangular outer shape in plan view, has insertion holes through which the lead wires pass, is attached to a bottom surface of the crystal oscillator, and has mount terminals to be electrically connected to the lead wires formed on a bottom surface thereof. The configuration is such that the insertion holes are provided in four corner sections of the pedestal, in the four corner sections of the bottom surface of the pedestal where the insertion holes are formed there is provided a recess with an open outer periphery, and the lead wire is connected to a terminal electrode formed in the recess, using solder.

According to such a configuration, the outer periphery of the recess is open, and hence it is possible to ensure a sufficient region for freely moving a soldering iron therein when soldering the lead wire and the terminal electrode. Therefore, it is possible to increase the efficiency of the soldering operation and increase the productivity of the oscillator with a pedestal.

In the present invention, furthermore the configuration is such that an extended section of the lead wire that extends into the recess is bent within the recess and housed in the recess. As a result, when a reflowing operation is performed where the oscillator with a pedestal is reverse-arranged on the lower side of a substrate that is arranged horizontal, that is, when a reflowing operation is performed with the oscillator with a pedestal where the pedestal is positioned on the upper side so as to face the circuit substrate and the crystal oscillator is positioned on the lower side, the solder that connects the lead wire led out from the crystal oscillator with the pedestal may melt in some cases. However, since the extended section of the lead wire is bent within the recess of the pedestal, the crystal oscillator will not fall off the pedestal, or there will not be a gap between the pedestal and the crystal oscillator.

Furthermore, the extended section of the lead wire that extends into the recess is bent and housed in the recess. Therefore, even if the lead wire is long, the lead wire will not project from the main surface of the pedestal, and the oscillator with a pedestal can be mounted on the circuit substrate.

Moreover, in the present invention, the configuration is such that the pedestal is of a laminated plate configured with a first substrate serving as an upper layer and a second substrate serving as a lower layer, and a cutaway is provided in each of four corner sections of the second substrate to thereby form the recess of the pedestal. As a result, it becomes possible to easily form the recess.

Furthermore, in the present invention, the pedestal comprises a glass epoxy resin. Moreover, it becomes possible to produce an oscillator with a pedestal more inexpensively compared to the case where the pedestal comprises a ceramic material.

BRIEF DESCRIPTION OF THE DRAWINGS

FIG. 1 includes drawings for describing a first embodiment of an oscillator with a pedestal of the present invention, wherein

FIG. 3 is a drawing for describing a first embodiment of a sheet substrate used in the present invention, wherein FIG. 1A is a partial plan view of a first sheet substrate.

FIG. 6 is a drawing for describing a conventional example of an oscillator with a pedestal, wherein

FIG. 8 is a drawing for describing another conventional example of an oscillator with a pedestal, wherein

DETAILED DESCRIPTION OF PREFERRED EMBODIMENT

First Embodiment

Figure 1A:
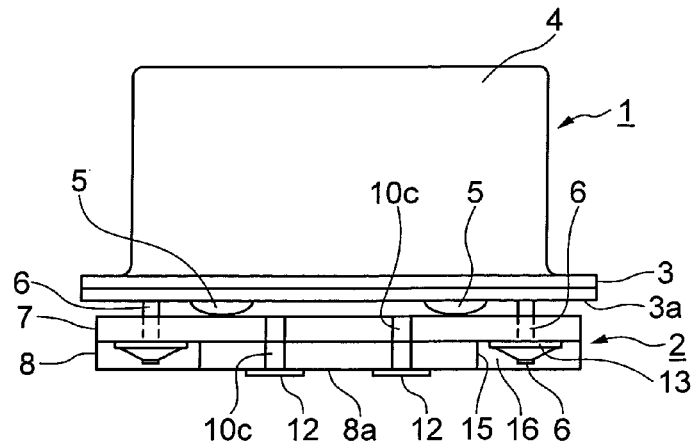
FIG. 1A is a front view thereof.
Figure 1B:
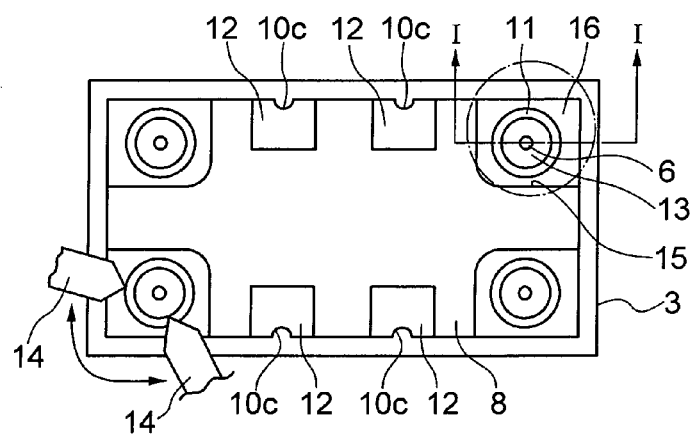
FIG. 1B is a bottom view thereof.
Figure 1C:
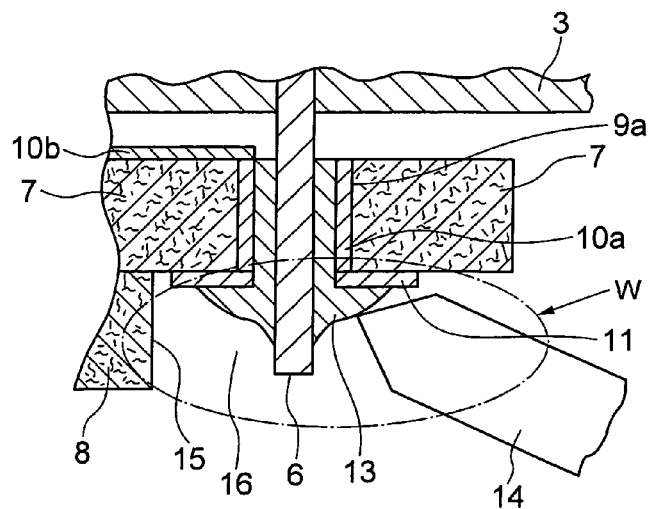
FIG. 1C is a sectional view thereof taken along the line I-I of FIG. 1B.
Figure 2A:
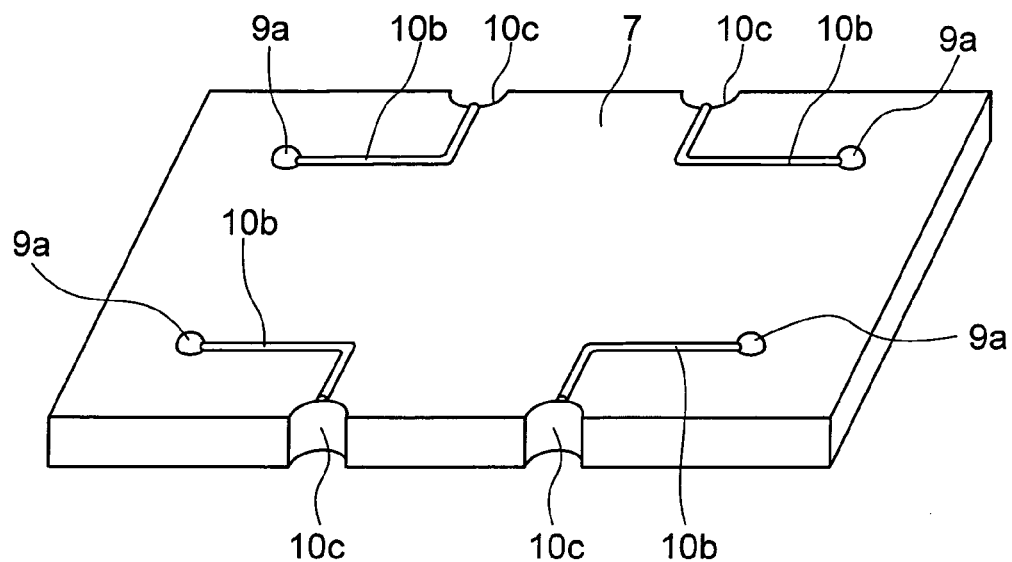
FIG. 2 is an exploded isometric view for describing a first embodiment of a pedestal of the present invention.

FIG. 1 and FIG. 2, as mentioned above, are drawings for describing a first embodiment of an oscillator with a pedestal of the present invention, wherein FIG. 1A is a front view thereof, FIG. 1B is a bottom view thereof, FIG. 1C is a partial sectional view thereof taken along the line I-I of FIG. 1B, and FIG. 2 is an exploded isometric view of the pedestal used in the present invention. Parts the same as in the conventional examples are denoted by the same reference symbols, and descriptions thereof are simplified or omitted.

In the crystal oscillator with a pedestal of the present invention, as shown in FIG. 1B, a pedestal 2 is attached to a crystal oscillator 1. The crystal oscillator 1 is configured with a crystal resonator (not shown in the drawing) and an oscillation circuit element (not shown in the drawing) and the like housed (enclosed) inside a metallic base 3, and a metallic cover 4 joined thereon. On an outer bottom surface 3a of the crystal oscillator 1, as shown in FIG. 1A, there are formed stand-offs 5 and four lead wires 6. These lead wires 6 are implanted perpendicular to the outer bottom surface 3a, and are electrically connected to the oscillation circuit element and the like housed in the metallic base 3.

Figure 2B:
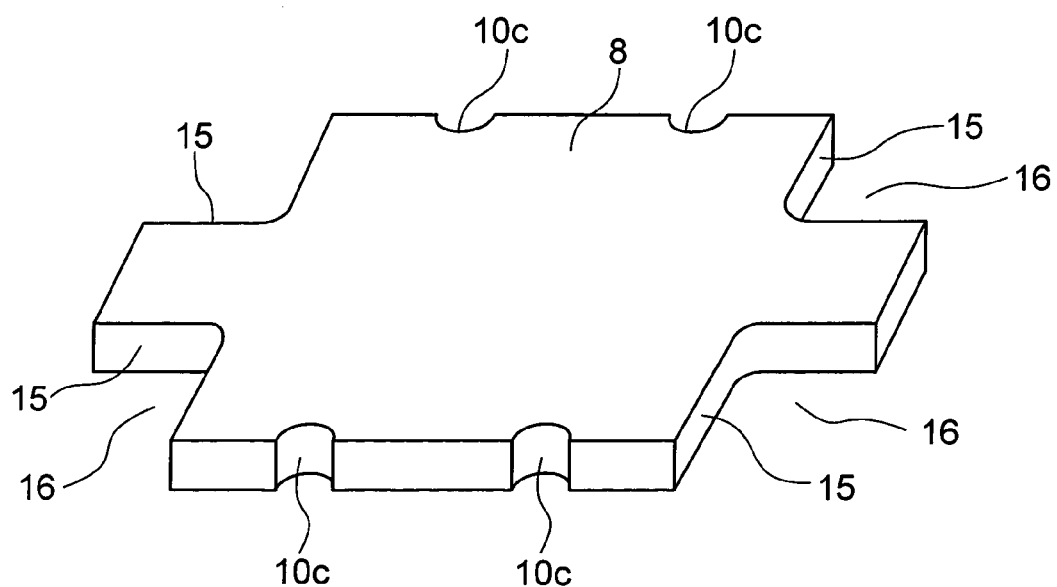

The pedestal 2 comprises a laminated glass epoxy resin plate comprising a first substrate 7 serving as an upper layer and a second substrate 8 serving as a lower layer. In each of the four corner sections of the first substrate 7 there is formed an insertion hole 9a through which the lead wire 6 is inserted (refer to FIG. 2A). Moreover, in each of the four corner sections of the second substrate 8 there is formed a cutaway 15 as shown in FIG. 2B. By laminating these first substrate 7 and the second substrate 8, a recess 16 with an open outer periphery section is formed in each of the four corner sections where the insertion hole 9a of the bottom surface of the pedestal 2 is formed (refer to FIG. 1B and FIG. 1C).

In each of the recesses 16, as shown in FIG. 1C, there is formed a terminal electrode 11. The lead wire 6 having passed through the insertion hole 9a is electrically connected to the terminal electrode 11 by means of solder 13. Moreover, the solder 13 that has flowed into the inner side of the insertion hole 10a, electrically and mechanically connects the lead wire 6 to a conducting path 10a. As a result, the lead wire 6 is electrically connected to a mount terminal 12 that is formed on a bottom surface 8a of the pedestal 2.

Figure 3A:
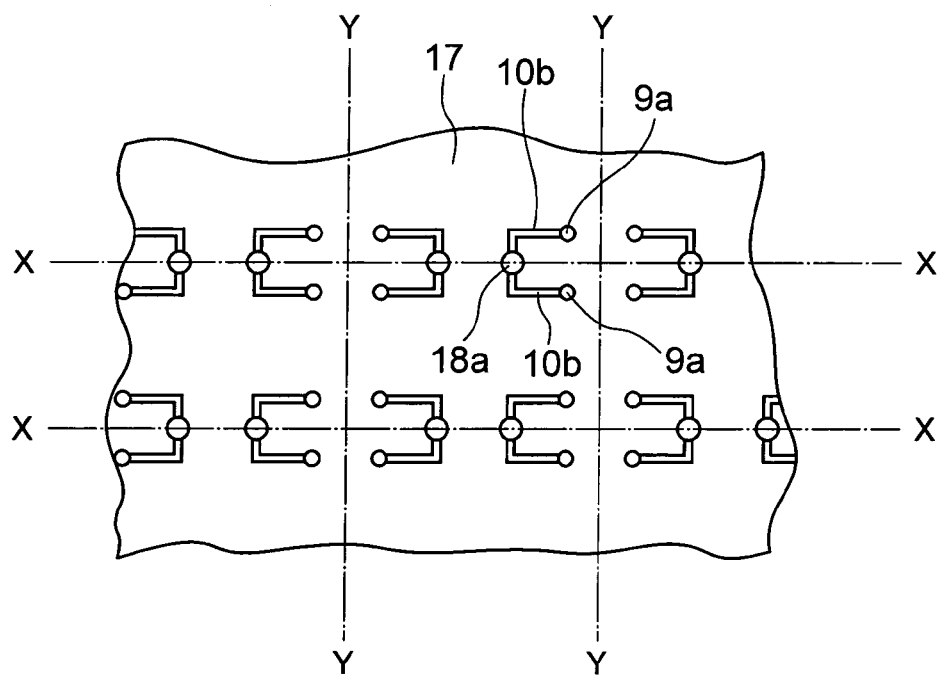

In such an embodiment, first, as shown in FIG. 3A, there is prepared a glass epoxy resin-made first sheet substrate (collective substrate) 17, which is eventually cut into individual pieces so as to serve as the first substrate 7. Then, in the first sheet substrate 17, there are formed the insertion holes 9a and through holes 18a that serve as conducting paths 10c. Subsequently, conducting paths 10a and 10c are formed on the inner side surface of each of the insertion holes 9 and through holes 18a (refer to FIG. 1A and FIG. 1C), and furthermore, conducting paths 10b are formed on one main surface of the first sheet substrate 17. Moreover, on the back side of the one main surface of the first sheet substrate 17 having the conducting paths 10b formed thereon, there are formed terminal electrodes 11 (refer to FIG. 1C).

Figure 3B:
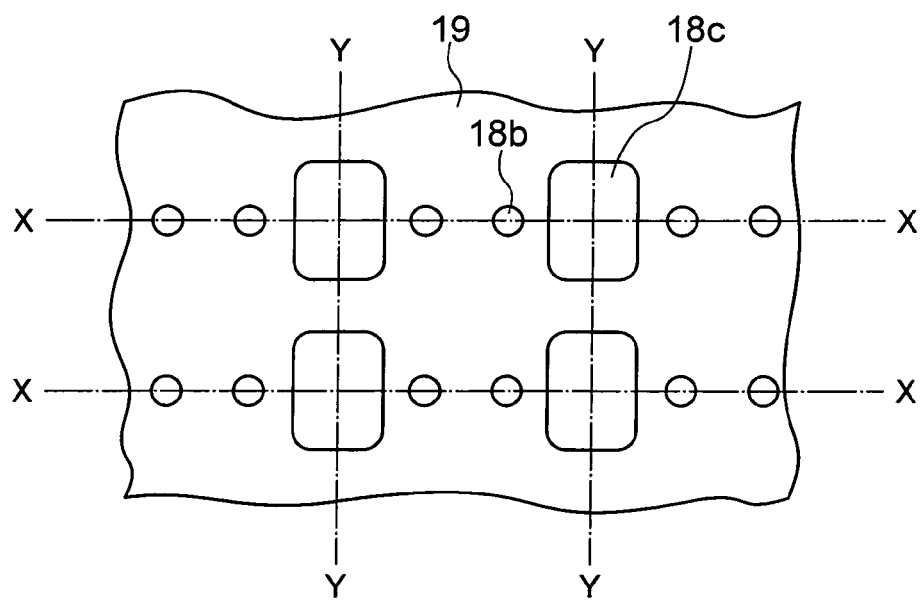
FIG. 3B is a partial view of a second sheet substrate.

Next, as shown in FIG. 3B, there is prepared a glass epoxy resin-made second sheet substrate (collective substrate) 19, which is eventually cut into individual pieces so as to serve as the second substrate 8. Then, in the second sheet substrate 19, there are formed through holes 18b, which serve as the conducting paths 10c, and through holes 18c, which serve as the cutaways 15. Subsequently, on the inner surface of each of the through holes 18b, there is formed the conducting path 10c. Moreover, on one main surface of the second sheet substrate 19, which serves as a back surface of the pedestal 2, there are formed the mount terminals 12 (refer to FIG. 1A). Here, the conducting paths 10a to 10c, the terminal electrodes 11, and the mount terminals 12 are formed by means of copper foil printing and gold plating for example.

Next, the first sheet substrate 17 and the second sheet substrate 19 are laminated by means of thermo-compression bonding for example. Then, both of the sheet substrates are cut along the parting lines X-X and Y-Y shown in FIG. 3A and FIG. 3B into individual pieces thereby forming the pedestal 2. Next, the pedestal 2 is attached on the bottom surface 3a of the preliminarily prepared crystal oscillator 1. Here, the lead wire 6 is passed through the insertion hole 9a. Finally, the lead wire 6 and the electrode 11 are connected with the solder 13 by means of soldering. The solder 13 flows into the inner side of the insertion hole 10a so as to electrically and mechanically connect the lead wire 6 to the conducting path 10a.

According to such a configuration, since the outer periphery of the recess 16 is open as shown in FIG. 1B and FIG. 1C, there can be sufficiently ensured a region W in which a soldering iron 14 can be freely moved around the lead wire 6 when soldering is performed. Therefore, it is possible to increase the efficiency of the soldering operation and increase the productivity of the oscillator with a pedestal.

Second Embodiment

Figure 4:
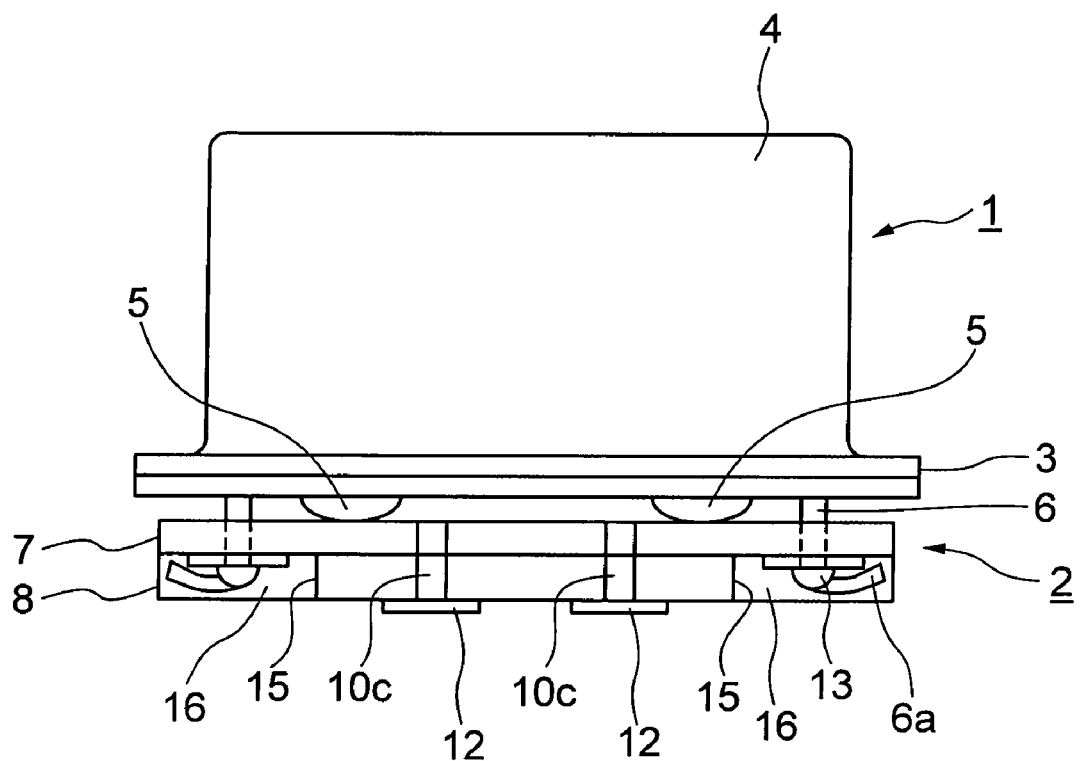
FIG. 4 is a front view for describing a second embodiment of an oscillator with a pedestal of the present invention.
Figure 5:
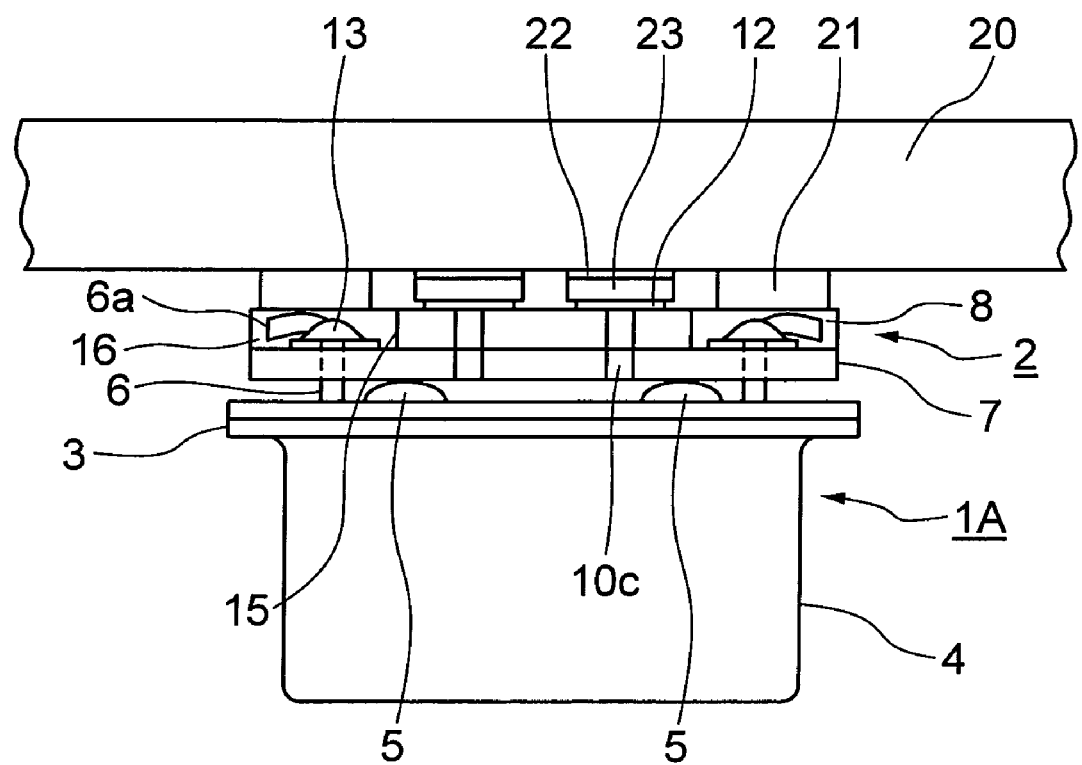
FIG. 5 is a front view at the time of performing a reflowing operation, for describing the second embodiment of the oscillator with a pedestal of the present invention.
Figure 6A:
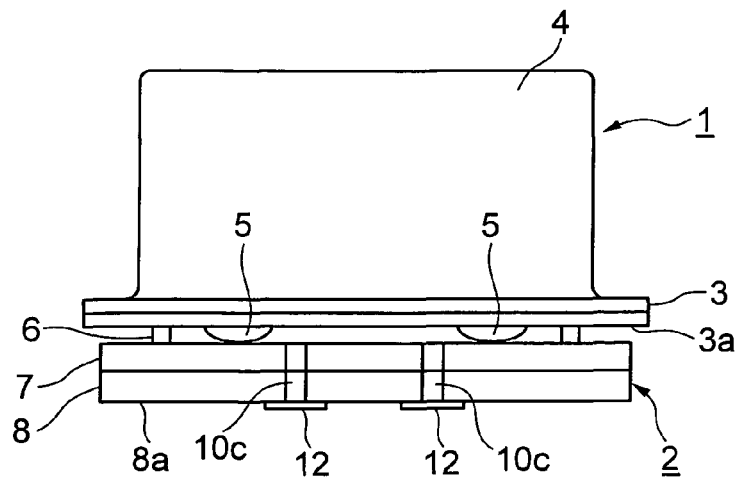
FIG. 6A is a front view thereof.
Figure 6B:
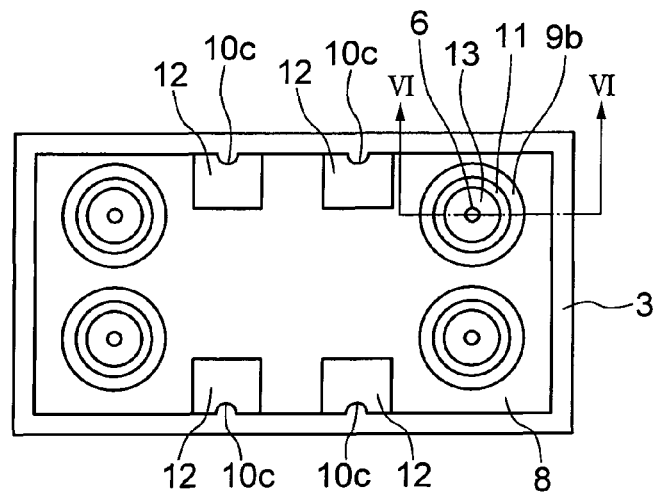
FIG. 6B is a bottom view thereof.
Figure 6C:
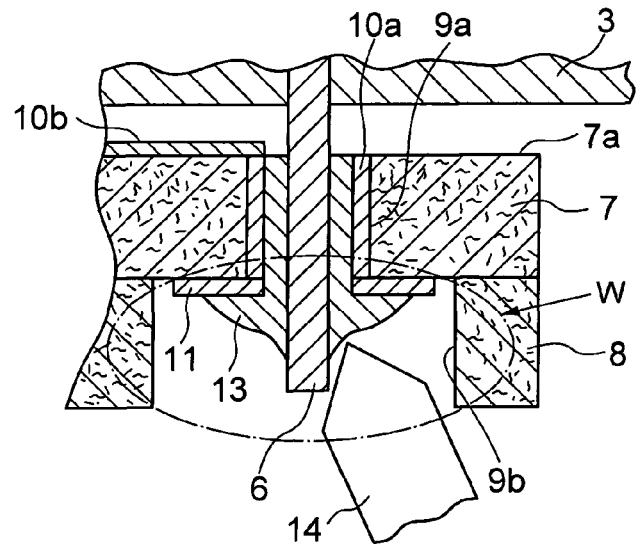
FIG. 6C is an enlarged sectional view thereof taken along the line VI-VI of FIG. 6B.
Figure 7A:
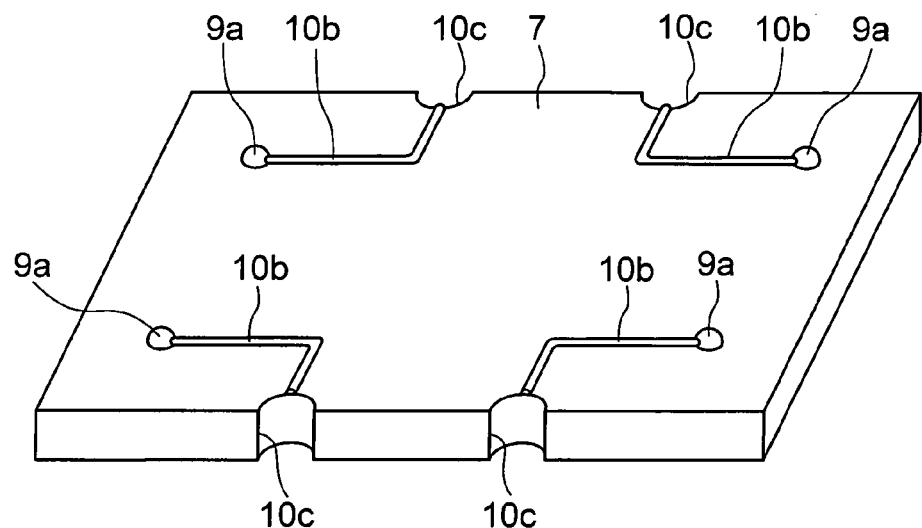
FIG. 7 is an exploded isometric view of a pedestal of the conventional example.
Figure 7B:
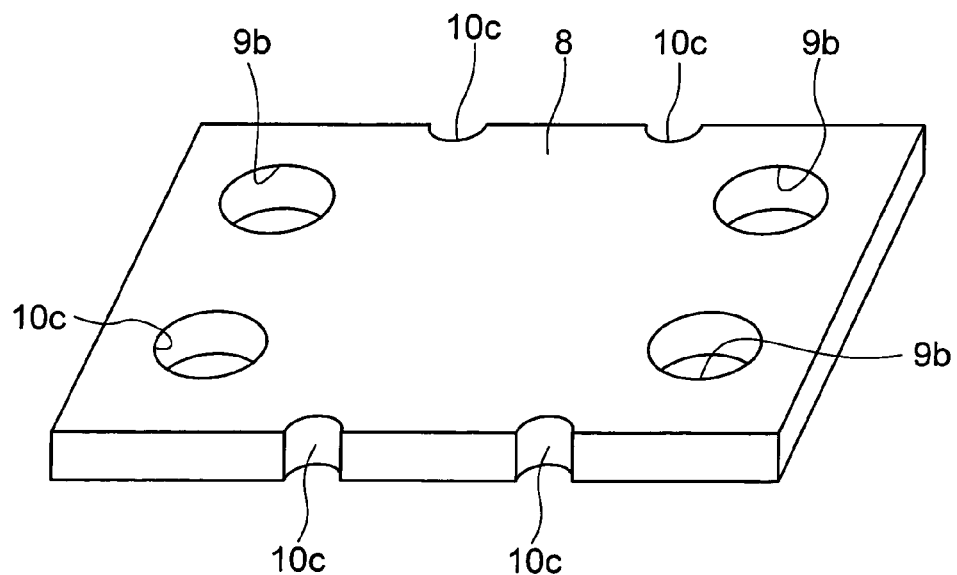
Figure 8A:
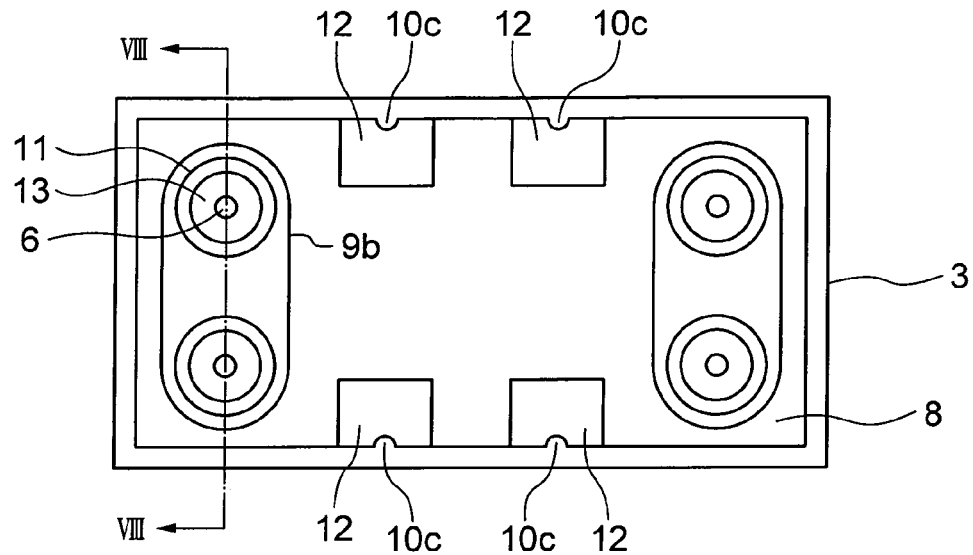
FIG. 8A is a bottom view thereof.
Figure 8B:
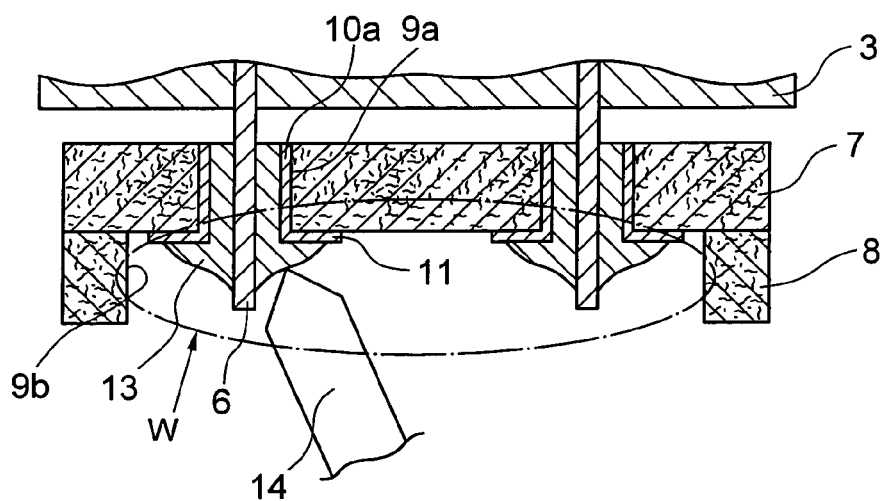
FIG. 8B is an enlarged sectional view thereof taken along the line VIII-VIII of FIG. 8A.
Figure 9A:
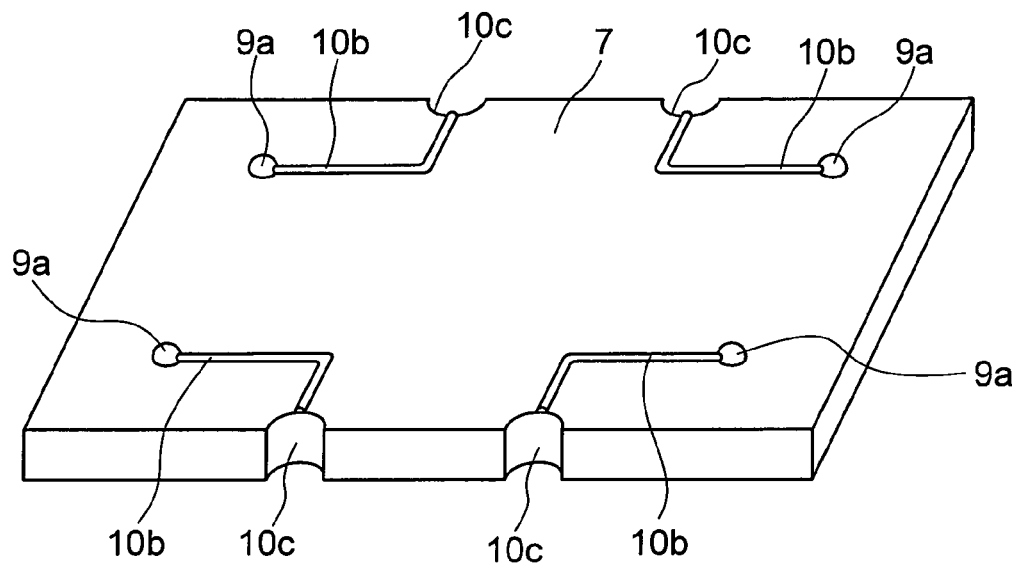
FIG. 9 is an exploded isometric view of another conventional example of a pedestal.
Figure 9B:
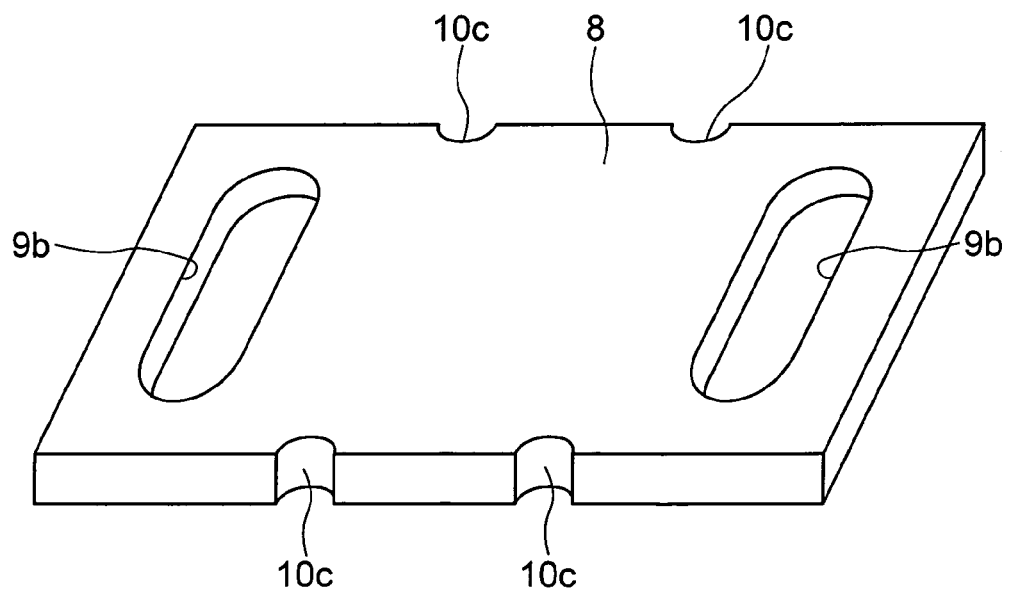

FIG. 4 and FIG. 5 are drawings for describing a second embodiment of an oscillator with a pedestal of the present invention, and as described above, wherein FIG. 4 is a front view thereof and FIG. 5 is a front view thereof at the time of performing a reflowing operation. Parts the same as in the conventional examples are denoted by the same reference symbols, and descriptions thereof are simplified or omitted.

The oscillator with a pedestal of the present embodiment differs from that of the first embodiment in the shape of an extended section 6a of the lead wire 6 that extends into the recess 16. That is to say, in the present second embodiment, the extended section (tip end section) 6a of the lead wire 6 is bent and housed within the recess 16.

According to such a configuration, as shown in FIG. 5, even in a case where an oscillator with a pedestal 1A is arranged upside-down (reversed) on the lower side of a circuit substrate 20 having the horizontally arranged oscillator 1 mounted thereon, and a reflowing operation is performed thereby mounting the oscillator with a pedestal 1A on the circuit substrate 20, it is possible to avoid the crystal oscillator 1 from falling off the pedestal 2, or avoid having a gap between the pedestal 2 and the crystal oscillator 1.

Hereunder, the second embodiment of the present invention is specifically described.

In the reflowing operation, as shown in FIG. 5, first, the circuit substrate 20 is horizontally arranged, and the oscillator with a pedestal 1A is arranged on the lower side of the circuit substrate 20 so that the pedestal 2 faces the circuit substrate 20. Consequently, the oscillator with a pedestal 1A is such that the pedestal 2 is positioned on the upper side and the crystal oscillator 1 is positioned on the lower side. Then, the pedestal 2 of the oscillator with a pedestal 1A and the circuit substrate 20 are temporarily joined for example by means of an adhesive agent 21. Next, the circuit substrate 20 is heated so as to melt solder 23 between the mount terminal 12 of the oscillator with a pedestal 1A and a terminal 22 of the circuit substrate 20, thereby adhering them, and thereby the oscillator with a pedestal 1A is mounted on the circuit substrate 20.

When heating this circuit substrate 20, the solder 13 that connects the lead wire 6 led out from the crystal oscillator 1 to the pedestal 2, may be molten in some cases. However, since the extended section 6a of the lead wire 6 is bent within each of the recesses 16 of the pedestal 2, the crystal oscillator 1 will not fall off the pedestal 2, or there will not be a gap between the pedestal 2 and the crystal oscillator 1.

Normally, a reflowing operation is often performed where the oscillator with a pedestal 1A is arranged on the circuit substrate 20 that is placed horizontally. However, depending on the circumstances of a process of manufacturing a device that uses the oscillator with a pedestal 1A, the reflowing operation may, in some cases, be required to be performed where the oscillator with a pedestal 1A is arranged reversed under the circuit substrate 20.

Moreover, the extended section 6a of the lead wire 6 that extends in the recess 16 formed on the second substrate 8 is bent and housed within the recess 16. Therefore, even if the lead wire 6 is long, the lead wire 6 will not project from the main surface of the pedestal 2, and the oscillator with a pedestal 1A can be mounted on the circuit substrate 20.

Furthermore, in the present second embodiment, the extended section 6a of the lead wire 6 may be squashed from the side surface and made into a flat plate shape (after it has been subjected to a squashing process) and then may be bent. As a result, even in a case where the depth of the recess 16 is shallow, the thickness of the extended section 6a of the lead wire 6 can be made thin. Therefore it is possible to avoid a situation where the lead wire 6 projects from the main surface of the pedestal 2.

In the first and second embodiments described above, the pedestal 2 is a laminated plate comprising two layers of the first substrate 7 and the second substrate 8. However, the first substrate 7 and the second substrate 8 may be respectively of a laminated plate with two or more layers. Moreover, the base material of the pedestal 2 may be a ceramic material. Furthermore, a recess may be provided in a portion on one main surface opposed to the crystal oscillator 1 of the first substrate 7 on the pedestal 2 that corresponds to each of the stand-offs 5 formed on the bottom surface of the crystal oscillator 1. As a result, it is possible to embed the stand-off 5 within the recess, and reduce the height of the crystal oscillator with a pedestal.

What is claimed is:
1. A surface mount crystal oscillator with a pedestal comprising:
 a crystal oscillator with lead wires led out from a bottom surface of a metallic base thereof; and a pedestal having a substantially rectangular outer shape in plan view, has insertion holes through which said lead wires pass, and is attached to a bottom surface of said crystal oscillator, and has mount terminals to be electrically connected to said lead wires formed on a bottom surface thereof, wherein said insertion holes are provided in four corner sections of said pedestal, in the four corner sections of the bottom surface of said pedestal where said insertion holes are formed there is provided a recess having a discontinuous lateral wall substantially perpendicular to the pedestal wherein the discontinuous lateral wall defines an open outer periphery, and said lead wire is connected to a terminal electrode formed in said recess, using solder.

2. A surface mount crystal oscillator with a pedestal according to claim 1, wherein an extended section of said lead wire that extends into said recess is bent within said recess and housed therein.

3. A surface mount crystal oscillator with a pedestal according to claim 1, wherein said pedestal is of a laminated plate configured with a first substrate serving as an upper layer and a second substrate serving as a lower layer, and a cutaway is provided in each of four corner sections of said second substrate thereby forming said recess of said pedestal.

4. A surface mount crystal oscillator with a pedestal according to claim 2, wherein said pedestal is of a laminated plate configured with a first substrate serving as an upper layer and a second substrate serving as a lower layer, and a cutaway is provided in each of four corner sections of said second substrate thereby forming said recess of said pedestal.

5. A surface mount crystal oscillator with a pedestal according to claim 1, wherein said pedestal comprises a glass epoxy resin.

6. A surface mount crystal oscillator with a pedestal according to claim 2, wherein said pedestal comprises a glass epoxy resin.

7. A surface mount crystal oscillator with a pedestal according to claim 3, wherein said pedestal comprises a glass epoxy resin.

8. A surface mount crystal oscillator with a pedestal according to claim 4, wherein said pedestal comprises a glass epoxy resin.

9. A surface mount crystal oscillator with a pedestal comprising:

a crystal oscillator with lead wires led out from a bottom surface of a metallic base thereof; and a pedestal having a substantially rectangular outer shape in plan view, has insertion holes through which said lead wires pass, and is attached to a bottom surface of said crystal oscillator, and has mount terminals to be electrically connected to said lead wires fondled on a bottom surface thereof, wherein said insertion holes are provided in four corner sections of said pedestal, in the four corner sections of the bottom surface of said pedestal where said insertion holes are formed there is provided a recess with an open outer periphery, and said lead wire is connected to a terminal electrode formed in said recess using solder, wherein said lead wire includes an extended section that extends into said recess and is bent within said recess and housed therein.

10. A surface mount crystal oscillator with a pedestal according to claim 9, wherein said pedestal is of a laminated plate configured with a first substrate serving as an upper layer and a second substrate serving as a lower layer, and a cutaway is provided in each of four corner sections of said second substrate thereby forming said recess of said pedestal.

11. A surface mount crystal oscillator with a pedestal according to claim 9, wherein said pedestal is of a laminated plate configured with a first substrate serving as an upper layer and a second substrate serving as a lower layer, and a cutaway is provided in each of four corner sections of said second substrate thereby forming said recess of said pedestal.

12. A surface mount crystal oscillator with a pedestal according to claim 9, wherein said pedestal comprises a glass epoxy resin.

13. A surface mount crystal oscillator with a pedestal according to claim 10, wherein said pedestal comprises a glass epoxy resin.

14. A surface mount crystal oscillator with a pedestal according to claim 11, wherein said pedestal comprises a glass epoxy resin.

15. A surface mount crystal oscillator with a pedestal according to claim 9, wherein each said recess has a discontinuous lateral wall substantially perpendicular to the pedestal wherein the lateral wall defines an open outer periphery.

16. A surface mount crystal oscillator with a pedestal comprising:

a crystal oscillator with lead wires led out from a bottom surface of a metallic base thereof; and a pedestal consisting of a glass epoxy resin and having a substantially rectangular outer shape in plan view, has insertion holes through which said lead wires pass, and is attached to a bottom surface of said crystal oscillator, and has mount terminals to be electrically connected to said lead wires formed on a bottom surface thereof, wherein said insertion holes are provided in four corner sections of said pedestal, in the four corner sections of the bottom surface of said pedestal where said insertion holes are foamed there is provided a recess with an open outer periphery, and said lead wire is connected to a terminal electrode formed in said recess, using solder wherein said lead wire includes an extended section that extends into said recess and is bent within said recess and housed therein.

17. A surface mount crystal oscillator with a pedestal according to claim 16, wherein said pedestal is of a laminated plate configured with a first substrate serving as an upper layer and a second substrate serving as a lower layer, and a cutaway is provided in each of four corner sections of said second substrate thereby forming said recess of said pedestal.

18. A surface mount crystal oscillator with a pedestal according to claim 16, wherein each said recess has a discontinuous lateral wall substantially perpendicular to the pedestal wherein the lateral wall defines an open outer periphery.

* * * * *